United States Patent [19]

Anthony et al.

[11] 3,998,653
[45] Dec. 21, 1976

[54] METHOD FOR CLEANING SEMICONDUCTOR DEVICES

[75] Inventors: Thomas R. Anthony; Harvey E. Cline, both of Schenectady; Mike F. Chang, Liverpool, all of N.Y.

[73] Assignee: General Electric Company, Schenectady, N.Y.

[22] Filed: Mar. 9, 1976

[21] Appl. No.: 665,277

[52] U.S. Cl. .................................. 134/1; 134/2; 156/5; 156/17
[51] Int. Cl.² .................................................. B08B 3/12
[58] Field of Search .................. 134/1, 2; 156/5, 7, 156/17, 22; 252/79.5; 29/576 R

[56] References Cited
UNITED STATES PATENTS

| 3,033,710 | 5/1962 | Hightower et al. | 134/1 |
| 3,041,226 | 6/1962 | Pennington | 156/17 |
| 3,607,477 | 9/1971 | Rao et al. | 134/2 X |
| 3,863,333 | 2/1975 | Loya | 156/5 X |

Primary Examiner—Robert L. Lindsay, Jr.
Assistant Examiner—Marc L. Caroff
Attorney, Agent, or Firm—Donald M. Winegar; Joseph T. Cohen; Jerome C. Squillaro

[57] ABSTRACT

A solution of potassium hydroxide is employed to remove the reaction products of aluminum migrated through silicon-semiconductor material by thermal gradient zone melting processing.

11 Claims, 4 Drawing Figures

METHOD FOR CLEANING SEMICONDUCTOR DEVICES

BACKGROUND OF THE INVENTION

1. Field of the Invention

This invention relates to a method for cleaning semiconductor devices and wafers processed by thermal gradient zone melting.

2. Description of the Prior Art

The recent introduction of thermal gradient zone melting processing (TGZM) as a new commercial manufacturing tool for making semiconductor devices has also introduced new problems on occasions. The most useful application of TGZM is to migrate aluminum "wires" through silicon wafers to produce planar electrical isolation regions. The regions protect the integrity of the electrical characteristics of individual devices. Additionally, the regions have sufficient width to enable one to laser scribe the wafer and divide or dice the wafer into individual devices for further processing and encapsulation.

However, the molten aluminum during the process reacts with air of the ambient in the apparatus, the silicon of the wafer, the adjacent silicon oxide of the mask employed in TGZM and forms a film reaction product which appear to be mullite, carborundum and mixtures thereof on the surfaces of the wafer as well as on the oxide layer. These reaction products inhibit further processing of the wafers and devices. In some instances, the presence of the reaction products has only an aesthetic effect. In other instances, the reaction products prevent the removal of portions of the oxide layer or prevents further processing of exposed surfaces of the silicon wafer.

Conventional means embodying known etching solutions employed in cleaning and etching silicon semiconductor material have proven to be unsuccessful in removing the reaction products. Aqua regia, phosphoric acid, bromine in methanol, and the like, fail to remove the reaction products. Mullite, in particular, is resistant to all acid and alkali etches with the exception of hydrofluoric acid which only very slowly attacks mullite. The use of a hydrofluoric acid etch is undesirable since this acid also removes the silicon oxide mask on the wafer and because the required reaction time is excessive.

Potassium hydroxide is a known etchant for selective etching of silicon but is most useful with the (100) geometry. The effect on the (111) geometry is very slight.

It is therefore an object of this invention to provide a new and improved method for removing the reaction products which result from migrating aluminum through silicon by thermal gradient zone melting which overcomes the deficiencies of the prior art.

Another object of this invention is to provide a new and improved etching solution of potassium hydroxide for removing the reaction products produced by the migration of aluminum through silicon by thermal gradient zone melting.

Other objects of this invention will, in part, be obvious and will, in part, appear hereinafter.

BRIEF DESCRIPTION OF THE INVENTION

In accordance with the teachings of this invention, there is provided a new and improved method for removing, by selective chemical etching, substantially all of the reaction products from surfaces of processed wafers of silicon semiconductor material. The reaction products are formed when aluminum metal, during the process of migration through the wafer by thermal gradient zone melting, reacts with the silicon and the masking material, usually silicon oxide.

Removal of the reaction products is accomplished in a bath of potassium hydroxide in water, the concentration of the potassium hydroxide being from about 2 percent to 67 percent by weight followed by mechanical agitation in a deionized water bath. The temperature of the bath is at least about 80° C and most usually between 101° C and 126° C. Preferably, the bath temperature is at about the boiling point temperature of the solution. For example, a temperature of about 110° C ± 5° C should be used for solutions of from 45 percent to 55 percent potassium hydroxide.

Following treatment in the potassium hydroxide bath, agitation of the wafer surface in deionized water is desirable to enhance the removal of the reaction products from surface areas of the processed wafer. Preferably, ultrasonic means have been found to be most suitable for employment in this improved method for removing the reaction products. Mechanical scrubbing can also be employed.

DESCRIPTION OF THE INVENTION

We have discovered that a solution of potassium hydroxide in water wherein potassium hydroxide is from 2 percent to 67 percent by weight of the solution will remove the reaction products resulting from the migrating of aluminum metal through silicon semiconductor material by temperature gradient zone melting.

Figure 1:
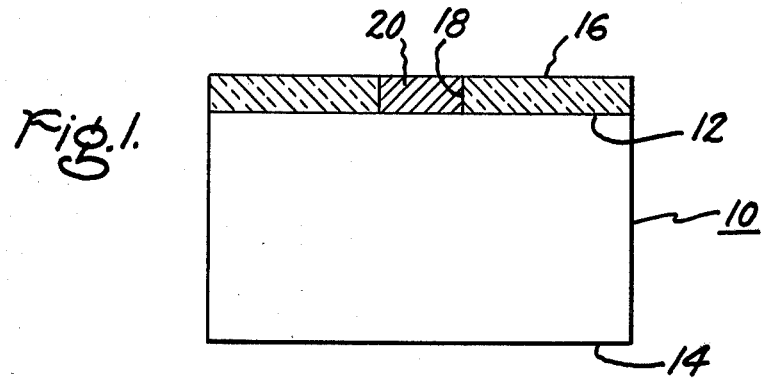
FIGS. 1, 2, 3 and 4 are side elevation views, in cross-section, of a silicon wafer having a major surface of (111) planar crystal orientation being processed in accordance with the teachings of this invention.

Referring now to FIG. 1, there is shown a wafer or body 10 of silicon semiconductor material having opposed major surfaces 12 and 14 being, respectively, the top and bottom surfaces thereof. At least the surface 12 has a preferred crystal planar orientation of (111).

The thermal gradient zone melting process entails forming a masking layer 16, of a suitable material such, for example, as silicon oxide, silicon nitride, aluminum nitride, and the like, on the surface 12 by any means known to those skilled in the art of processing semiconductor material. Preferably, because of the commercial process employed, the material of the layer 16 is silicon oxide. Windows, defined by wall surfaces 18, are opened in the layer 16 to expose selected areas of the surface 12 therein. Aluminum metal 20, preferably substantially oxygen free aluminum metal, is deposited on the exposed area of the surface 12 through the windows.

In the presently employed commercial apparatus, the wafer 10 is heated to an elevated temperature range of from about 1000° C to 1250° C and a thermal gradient is established substantially aligned parallel with the < 111 > axis across the thickness of the wafer 10 between the surfaces 12 and 14. The surface 14 is maintained at the higher temperature of the thermal gradient. Upon reaching the elevated temperature range, the aluminum metal 20 melts and alloys with silicon material of the surface 12 in contact therewith to form a melt 22 (FIG. 2) of aluminum-rich silicon.

Figure 2:
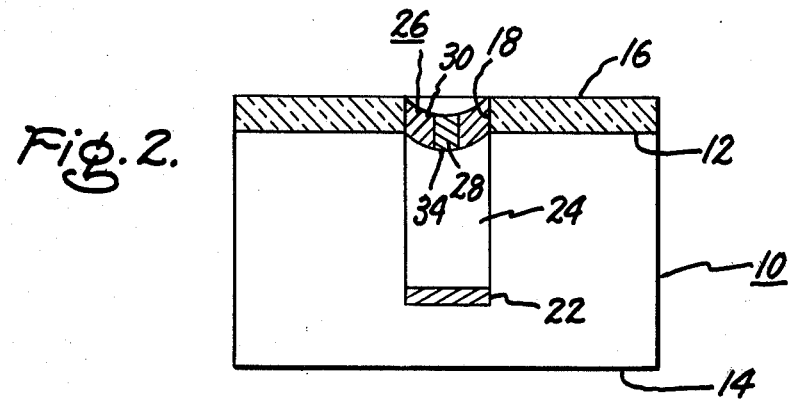

With reference to FIG. 2, the melt 22 of aluminum-rich silicon migrates along the temperature gradient from the surface 12 toward the surface 14 of higher temperature. As the melt 22 migrates through the wafer 10 it leaves behind a region 24 of recrystallized silicon semiconductor material of the wafer 10 which contains aluminum distributed substantially uniformly throughout the region. The level of concentration of the aluminum is equal to the solid solubility limit of aluminum in silicon at the temperature of migration. The total processing time to migrate the melt 22 through the wafer 10 is of the order of about 10 to 15 minutes for a wafer thickness of about 10 mils.

During the formation of the melt 22 of aluminum-rich semiconductor material on the surface 12 of the wafer 10, an integral film 26 of carborundum 28 and mullite 30 is formed on the surface of the melt 22. The film 26 bridges the window and is integral with the layer 16 of silicon oxide at the wall surface 11.

After migration and upon cooling, the processed wafer 10 is placed in a bath of solution of potassium hydroxide in water. The solution attacks and dissolves away the carborundum portion 28 of the film 26. The mullite portion 30 of the film 26 is very resistant to the chemical attack of the solution and remains substantially intact. The removal of the carborundum portion of 28 of the film 26 exposes surface 34 of the region 24 of recrystallized semiconductor material to the solution of potassium hydroxide in water. Recalling that the surface 12 is or is parallel to a (111) crystallographic plane and that the etch rate for the crystallographic planes in silicon decreases in the following sequence:

(High Order Planes) > (100) > (110) > > (111)

—that is to say, the etch rate of high order planes is greater than the etch order rate of (100) planes which in turn is greater than the etch rate of (110) planes which in turn is much greater than the etch rate of (111) planes— then it is apparent that the potassium hydroxide solution will preferentially etch from the etch initiation area in directions parallel with the (111) plane and therefore parallel with the surface 12.

We have unexpectedly discovered that the etch rate of the recrystallized silicon containing the solid solubility limit of aluminum 20 is much greater than the etch rate of the parent semiconductor material of the wafer 10. Consequently, after a suitably long etch in the potassium hydroxide solution, the processed wafer 10 is as shown in FIG. 3.

Figure 3:
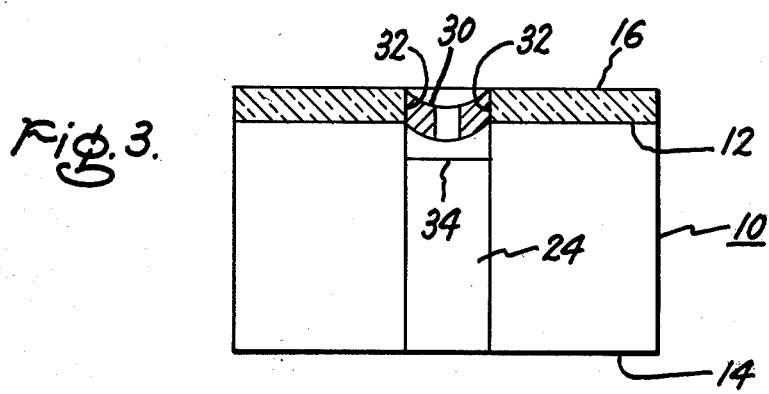
Figure 4:
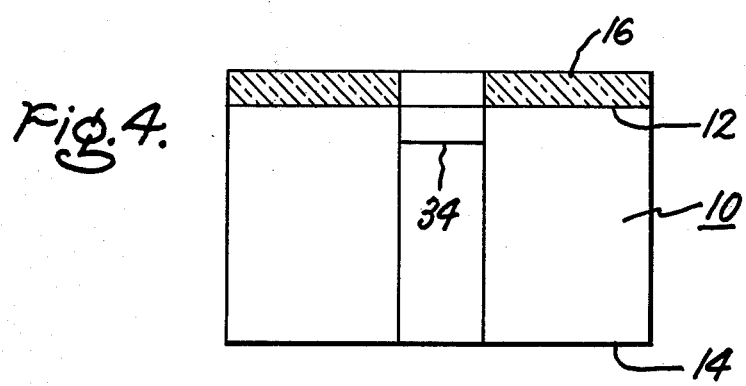

Referring to FIG. 3, the mullite portion 30 of the film 26 is now only held to the silicon oxide layer 16 by a band 32. In this cantilever position, the portions of mullite 18 are very susceptable to mechanical fracturing along the surface of the band 32. Consequently, by employing a light mechanical agitation or scrubbing action, or ultrasonic agitation, and the like, the mullite 30 portions of the film 26 of reaction products are physically broken off from the layer 16 and the wafer 10 leaving the wafer 10 substantially free of any reaction products. The processed wafer 10 is shown in FIG. 4.

The potassium hydroxide solution may contain from 2 percent to 62 percent by weight potassium hydroxide in water. Whereas, a 15 percent by weight potassium hydroxide solution gives the best resolution of least depth etched for the maximum removal of products, the etching rate is slow. It has been found that little, if any, cleaning or removal of the reaction products from the surfaces occurs at temperatures of about 20° C to 25° C. Even when left in the solution for 15 to 20 minutes, no appreciable cleaning action is noted.

When the bath containing 15 percent by weight solution is heated to about 60° C, the cleaning action proceeds at a greater rate but still is not acceptable for commercial production operations.

We have discovered that the best solution is one wherein potassium hydroxide is present in from 35 percent to 67 percent by weight. The temperature of the bath is from about 107° C to about 127° C. Preferably, the potassium hydroxide should be about 50 ± 5 percent by weight and the temperature of the bath about 113° C. The bath temperature in all instances is the approximate boiling point of the potassium hydroxide solution.

A preferred cleaning cycle for removing the reaction products includes chemically etching the processed wafer 10 in a 50 percent by weight potassium hydroxide solution in water at its boiling point for about 3 minutes. After etching, the wafer 10 is placed in a bath of deionized water agitated by ultrasonic means for from 1 to 3 minutes. Upon removal from the ultrasonic bath, the wafer 10 is rinsed in deionized water and dried. The wafer is now suitable for further processing, the reaction product having been removed from the surfaces.

We claim as our invention:

1. A method for removing reaction products produced on surface areas of a silicon wafer by the reaction of molten aluminum with silicon oxide and silicon on said surface areas including the steps of
   preparing a bath of a selective chemical etchant comprising a solution of potassium hydroxide in water wherein the concentration of the potassium hydroxide is from 2 to 67 percent by weight;
   heating the bath to a temperature of at least 80° C;
   placing said silicon wafer in the bath;
   removing at least a portion of the reaction products and a selected portion of silicon base material from surface areas of the said wafer by selective chemical etching in the bath;
   and removing a portion of the reaction products from said etched wafer by mechanical agitation.

2. The method of claim 1 wherein
   the temperature of the bath is approximately that of the boiling point of the solution.

3. The method of claim 1 wherein
   the removal of a portion of the reaction products by agitation is practiced in a separate bath of deionized water.

4. The method of claim 1 wherein
   the percentage of weight of potassium hydroxide in the solution is from 45 to 55.

5. The method of claim 4 wherein
   the percentage by weight of potassium hydroxide in the solution is about 50%.

6. The method of claim 4 wherein
   the temperature of the bath is about 110° C ± 5° C.

7. The method of claim 2 wherein
   the temperature of the bath is from about 101° C to about 127° C.

8. The method of claim 4 wherein
   the temperature of the bath is approximately that of the boiling point of the solution,
   etching in the bath is practiced for about 3 minutes, and
   the removal of a portion of the reaction products by agitation is practiced in a separate bath of deionized water for a period from about 1 to 3 minutes.

9. The method of claim 8 wherein said agitation is produced by ultrasonic energy.

10. The method of claim 9 wherein the percent of potassium hydroxide by weight in the solution is about 50.

11. The method of claim 8 wherein said agitation is produced by mechanical scrubbing.

* * * * *